United States Patent
Min et al.

(10) Patent No.: US 12,135,344 B2
(45) Date of Patent: Nov. 5, 2024

(54) VOLTAGE STABILITY SMART METER FOR ANALYZING VOLTAGE DATA AND CONTROLLING AN ELECTRICAL POWER SOURCE AND/OR AN ELECTRIC APPLIANCE

(71) Applicant: Lawrence Livermore National Security, LLC, Livermore, CA (US)

(72) Inventors: Liang Min, Pleasanton, CA (US); Nan Duan, Livermore, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 364 days.

(21) Appl. No.: 16/997,872

(22) Filed: Aug. 19, 2020

(65) Prior Publication Data

US 2021/0055334 A1 Feb. 25, 2021

Related U.S. Application Data

(60) Provisional application No. 62/890,390, filed on Aug. 22, 2019.

(51) Int. Cl.
G01R 22/06 (2006.01)
G06N 7/01 (2023.01)
G06Q 50/06 (2012.01)

(52) U.S. Cl.
CPC ............ *G01R 22/063* (2013.01); *G06N 7/01* (2023.01); *G06Q 50/06* (2013.01)

(58) Field of Classification Search
None
See application file for complete search history.

(56) References Cited

U.S. PATENT DOCUMENTS

| | | | |
|---|---|---|---|
| 7,200,500 B2* | 4/2007 | Larsson | H02J 3/00 702/57 |
| 2008/0086239 A1* | 4/2008 | Zhang | H02J 3/144 700/295 |
| 2017/0351288 A1* | 12/2017 | Li | G05F 1/66 |
| 2018/0106640 A1* | 4/2018 | Padrones | G01R 22/063 |
| 2020/0076196 A1* | 3/2020 | Lee | H02J 3/008 |
| 2020/0209841 A1* | 7/2020 | Srinivasan | H02J 3/381 |
| 2020/0409323 A1* | 12/2020 | Spalt | G06Q 50/06 |

OTHER PUBLICATIONS

Platt, John C. "Sequential Minimal Optimization: A Fast Algorithm for Training Support Vector Machines," Microsoft Research, Technical Report MSR-TR-98-14, Apr. 21, 1998, 21 pages.

* cited by examiner

*Primary Examiner* — Mohammad Ali
*Assistant Examiner* — Saad M Kabir
(74) *Attorney, Agent, or Firm* — Perkins Coie LLP

(57) ABSTRACT

Systems and methods for voltage stability monitoring and active/reactive power support are disclosed herein. In some embodiments, a smart electric meter of an end user in a grid power system can measure the voltage supplied to the end user via the grid power system, and can analyze the voltage data to detect critical voltage characteristics. The critical voltage characteristics may indicate that a voltage collapse event is likely. The smart electric meter can further estimate a voltage stability margin based on the voltage data. If necessary, the smart electric meter can control an electrical power source and/or an electric appliance positioned at or near the end user to increase the voltage stability margin.

18 Claims, 4 Drawing Sheets

VOLTAGE STABILITY SMART METER FOR ANALYZING VOLTAGE DATA AND CONTROLLING AN ELECTRICAL POWER SOURCE AND/OR AN ELECTRIC APPLIANCE

CROSS-REFERENCE TO RELATED APPLICATION

This application claims the benefit of U.S. Provisional Patent Application No. 62/890,390, filed Aug. 22, 2019, and titled "VOLTAGE STABILITY SMART METER," which is incorporated herein by reference in its entirety.

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

The present technology generally relates to smart electric meters configured to monitor voltage stability and/or react to voltage stability events at the house or building level.

BACKGROUND

An electric power system, such as the "electric grid," is a network of electrical components deployed to supply, transfer, and use electric power across an extended area. The electric grid broadly includes: (i) power stations (e.g., hydroelectric plants, nuclear plants, solar farms, wind farms, etc.) that supply the electrical power at high voltage, (ii) transmission systems that carry the power away from the power stations to substations that step down the high voltage, and (iii) distribution systems that feed the power to nearby end users (e.g., homes, buildings, etc.). The electric grid generally relies on three-phase AC power—the standard for large-scale power transmission and distribution across the modern world.

Voltage stability is the ability of an electric power system to maintain steady voltages at all system buses (e.g., homes, buildings, etc.) during normal operating conditions and after a disturbance. Voltage instability arises when the system impedance or load exceeds the power generation and transmission capabilities of the system. For example, the disconnection of transmission elements (e.g., transmission lines, substations, etc.) and/or the increased use of electric appliances (e.g., water heaters, refrigerators, air conditioners, dryers and washing machines, etc.) can increase the system impedance and/or reduce the load impedance. A voltage collapse may occur if the ratio between the system impedance and the load impedance exceeds the ability of the system to react and supply power, leading to an uncontrollable and continuous drop in system voltage that can cause, for example, electric appliances to stall.

Typically, voltage stability issues are analyzed in aggregate for the entire electric grid because it is difficult to measure voltage stability at the end-user level. Accordingly, most existing strategies for mitigating voltage stability issues focus on controlling the system impedance at the transmission side.

DETAILED DESCRIPTION

Figure 1:
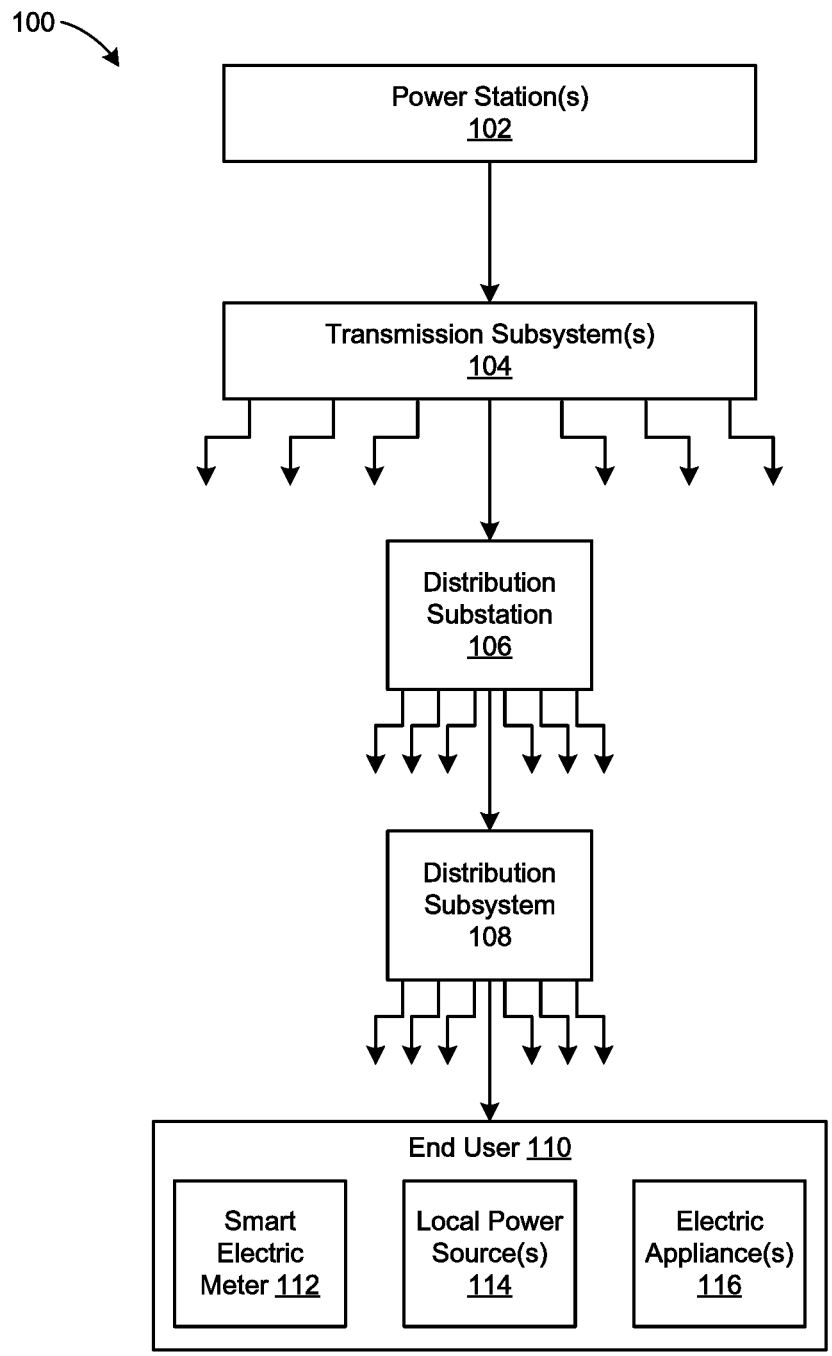
FIG. 1 is a schematic diagram that illustrates components of an electric power system configured in accordance with some embodiments of the present technology.

The present technology is generally directed to methods and systems for demand-side (e.g., bottom-up) voltage stability monitoring and active/reactive power support. In some embodiments, smart electric meters can be positioned at end users (e.g., residential homes, commercial buildings, etc.) in a grid power system and can measure the voltage—among other measures—supplied to the end users via the grid power system. Each smart meter can measure and analyze a voltage profile in real-time or near real time to detect critical voltage characteristics—such as a dip in voltage that may indicate that a voltage collapse event is likely. After detecting a critical voltage characteristic, the smart meters can estimate a real-time or near real-time voltage stability margin based on the measured voltage profile. If the voltage stability margin is below a predefined threshold, the smart meters can communicate with and control local power sources (e.g., photovoltaic systems) and/or smart appliances to increase the voltage stability margin by increasing power transfer to or reducing energy consumption by the end user-potentially mitigating or avoiding the voltage collapse event.

In some embodiments, the smart meters can detect the critical voltage characteristics by comparing the measured voltage profile to predicted, non-critical voltage profiles based on historical meter data. For example, the smart meters can employ a machine learning algorithm to generate predictions of non-critical voltage profiles, and can compare the measured voltage profile to the predicted voltage profiles to determine whether the measured voltage profile is outside a predefined threshold from any of the predicted voltage profiles. If so, the smart meters can mark the voltage profile as critical. Then, in some embodiments, the smart meters can employ a voltage stability margin algorithm that estimates the equivalent Thevenin voltage and impedance individually for each phase of the transferred power (e.g., three-phase AC power).

In one aspect of the present technology, the smart meters enable active/reactive power control at an individual phase of an individual end user (e.g., home or building). This is expected to significantly improve the resiliency of the grid power system by monitoring and controlling the voltage stability margin at the level of the end users. That is, the smart meters of the present technology can both (i) observe the load of an individual end user and (ii) actively monitor and address potentially harmful fluctuations in the load. In contrast, conventional strategies for mitigating critical voltage events tend to focus on controlling the overall system impedance at the transmission side due to the unobservability of the load at the level of the end users.

Specific details of several embodiments of the present technology are described herein with reference to FIGS. 1-5. However, the present technology may be practiced without some of these specific details. In some instances, well-known structures and techniques often associated with electric power systems, electric meters, voltage/power calculations, etc., have not been shown/described in detail so as not to obscure the present technology. The terminology used in the description presented below is intended to be interpreted in its broadest reasonable manner, even though it is being used in conjunction with a detailed description of certain specific embodiments of the disclosure. Certain terms may even be emphasized below; however, any terminology intended to be interpreted in any restricted manner will be overtly and specifically defined as such in this Detailed Description section.

FIG. 1 is a schematic diagram that illustrates components of an electric power system 100 ("system 100") configured in accordance with some embodiments of the present technology. The system 100 can be an electric grid system including one or more power stations 102, such as hydroelectric plants, nuclear plants, solar farms, wind farms, etc., configured to generate electrical power at a high voltage. One or more transmission subsystems 104 (e.g., high voltage transmission lines) can efficiently carry the high voltage power from the power station 102 to a plurality of distribution substations 106 (only one substation 106 is shown in FIG. 1), which step the power down to a lower, distribution-appropriate voltage. A distribution subsystem 108 (e.g., low voltage transmission lines) distributes the power from each of the substations 106 to end users 110 (only one end user 110 is shown in FIG. 1), such as residential homes, apartment buildings, individual apartments or units within the apartment buildings, housing complexes (e.g., small house communities), individual houses in the housing complexes, commercial buildings, industrial building, etc. In some embodiments, the system 100 can include more or fewer components, such as additional substation transformers, power stations connected to the distribution subsystems 108, etc.

In the illustrated embodiment, each of the end users 110 includes a smart electric meter 112 ("meter 112"), and optionally includes one or more (i) local power sources 114 (e.g., distributed energy resources) and/or (ii) electric appliances 116 (e.g., smart appliances). The local power sources 114 can be power sources positioned at or near the end user 110. For example, the local power sources 114 can be photovoltaic panels mounted on a home or building of the end user 110, temporary energy stores (e.g., batteries), etc. The appliances 116 can be electric appliances that are controllable (e.g., via a communication network) to increase, decrease, or shift/alter their power consumption. For example, the appliances 116 could include HVAC systems, water heaters, refrigerators, dryers, washing machines, etc.

The meter 112 can be installed on the premises of the end user 110 and is configured to measure an amount of electrical energy consumed by the end user 110 for residential, commercial, industrial, or other uses (e.g., to power the appliances 116). More specifically, the meter 112 can be connected in-line between the end user 110 and the distribution subsystem 108 and is configured to measure the current and voltage values supplied to the end user 110. In some embodiments, the meter 112 can measure the voltage and current in real-time or near real-time to produce a voltage profile (e.g., a current voltage profile). In some embodiments, the meter 112 can measure voltage and current individually for different phases (e.g., three phases) of the power supply. The meter 112 can further process the current and voltage values to calculate meter readings such as, for example, real power, reactive power, power factor, root mean square (RMS) voltage, etc. The foregoing measurements can collectively be referred to herein as "meter measurements." Some or all of the meter measurements may have a relatively large variation as, for example, more or fewer of the appliances 116 are turned on/off and draw power.

In some embodiments, the meter 112 can communicate time-synchronized measurements over a communication network (not shown; e.g., a cellular network, Wi-Fi network, etc.) to a computing device associated with the power station 102, the distribution subsystem 108, the end user 110, a monitoring source, a billing source, etc. Traditionally, electric meters are used to record the amount of electrical energy consumed for billing purposes. As described in detail below, however, the meter 112 can calculate a real-time estimate of the voltage stability margin for the end user 110 and can control one or more of the local power sources 114 and/or the appliances 116 to increase the voltage stability margin to thereby reduce the likelihood of a voltage collapse event.

Figure 2:
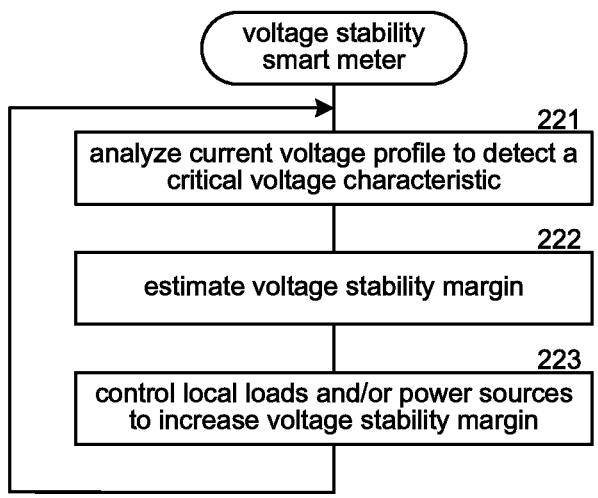
FIG. 2 is a flow diagram that illustrates the overall processing and operation of a voltage stability smart meter in accordance with some embodiments of the present technology.

More specifically, FIG. 2 is a flow diagram that illustrates the overall processing and operation of a voltage stability smart meter in accordance with some embodiments of the present technology. Some aspects of the processing are described in the context of the system 100 and the smart meter 112 shown in FIG. 1 although, in other embodiments, some or all of the processing can be carried out in other suitable systems (e.g., other grid power systems) and/or elsewhere in the system 100 (e.g., at a computing device other than the meter 112).

In block 221, the meter 112 analyzes a currently measured voltage profile to detect a critical voltage characteristic—such as a voltage characteristic that may indicate that a voltage collapse event is likely. In some embodiments, the meter 112 can detect the critical voltage characteristic by comparing the measured voltage profile to predicted, non-critical voltage profiles that are based on historical meter data. For example, the meter 112 can employ a machine learning algorithm to generate the predicted (non-critical) voltage profiles. The meter 112 can then compare the measured voltage profile to the predicted voltage profiles to determine whether the measured voltage profile is outside a predefined threshold from any of the predicted voltage profiles. If so, the meter 112 can mark the voltage profile as critical. In some embodiments, the meter 112 analyzes historical data to detect, individually, critical voltage characteristics for each phase of the transferred power (e.g., three-phase AC power). In other embodiments, the meter 112 can detect critical voltage characteristics by comparing other meter measurement profiles—such as current profiles, power profiles, etc.—to predicted profiles.

In block 222, after detecting the critical voltage characteristic, the meter 112 can estimate a real-time or near real-time voltage stability margin, active power transfer margin, and/or other electrical margin based on the measured voltage profile. In general, the voltage stability margin can be defined as the difference between the loadability limit and the current operating load of the end user 110. Similarly, the active power transfer margin can be defined as the amount of active power that can be transferred to the end user 110 before voltage instability occurs. In some embodiments, the meter 112 can employ a voltage stability margin algorithm that estimates the equivalent Thevenin voltage and impedance for each phase of the transferred power.

In block 223, if any phase's voltage stability margin is smaller than a predefined threshold, the meter 112 can trigger phase-wise active/reactive power support at the end user 110 to increase the voltage stability margin and/or the active power transfer margin to mitigate or even prevent a potential voltage collapse event. In some embodiments, the meter 112 can send a control signal to one or more of the appliances 116 to reduce their power consumption. For example, the meter 112 could send a control signal to a smart HVAC system to reschedule a cooling cycle (e.g., to delay and/or reduce the cooling) to reduce the current active power consumption of the end user 110. Alternatively or additionally, the meter 112 can send a control signal to one or more of the local power sources 114 to increase the active power transfer to the end user 110. For example, the meter 112 could send a control signal to a smart-inverter-enabled photovoltaic system to redirect/increase power transfer to the end user 110.

Accordingly, in one aspect of the present technology, the meter 112 enables active/reactive power control at an individual phase of an individual building. When many of the meters 112 are installed across the system 100, the meters 112 are expected to significantly improve the resiliency of the overall system 100 by monitoring and controlling the voltage stability margin individually for each of the end users 110. In contrast, existing strategies for mitigating voltage collapse events tend to focus on controlling the overall system impedance at the transmission side (e.g., at the power station 102 and/or the transmission subsystem 104) due to the unobservability of the load at the level of the end users 110. However, the meters 112 of the present technology are configured to both observe the load of an individual end user and to actively monitor and address potentially harmful fluctuations in the load.

Figure 3:
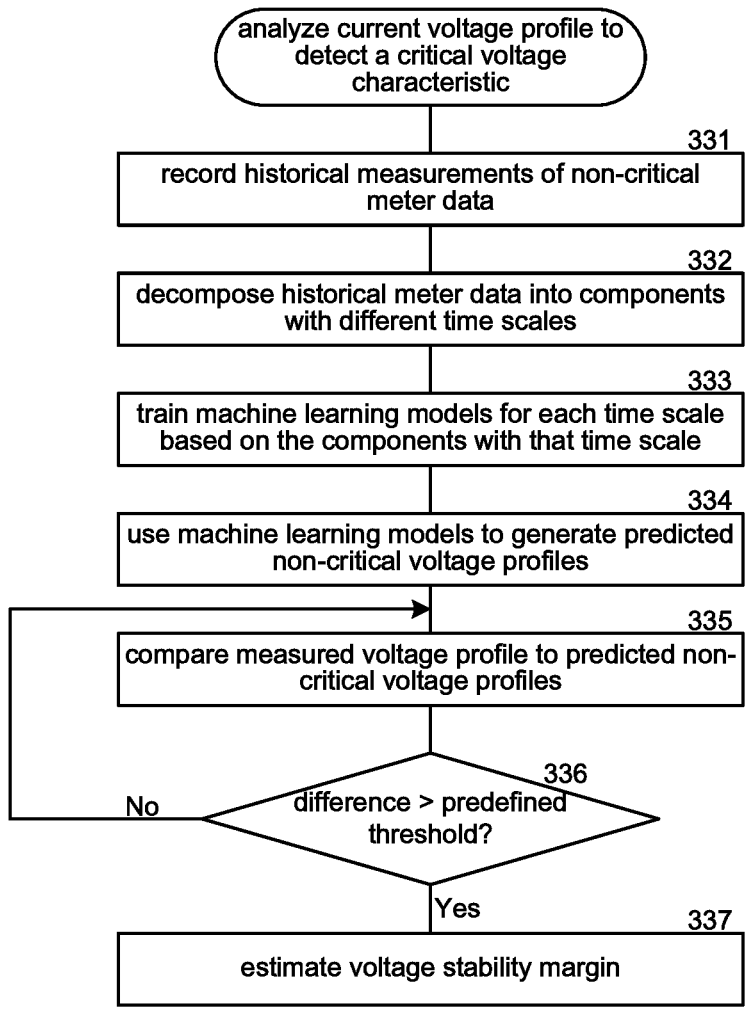
FIG. 3 is a flow diagram that illustrates the processing of a critical voltage detection component of the voltage stability smart meter in accordance with some embodiments of the present technology.
Figure 4:
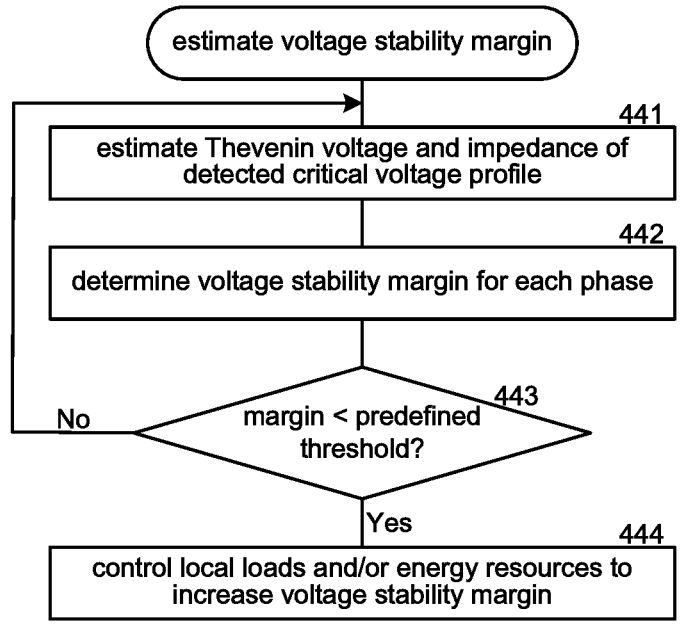
FIG. 4 is a flow diagram that illustrates the processing of a voltage stability margin estimation component of the voltage stability smart meter in accordance with some embodiments of the present technology.
Figure 5:
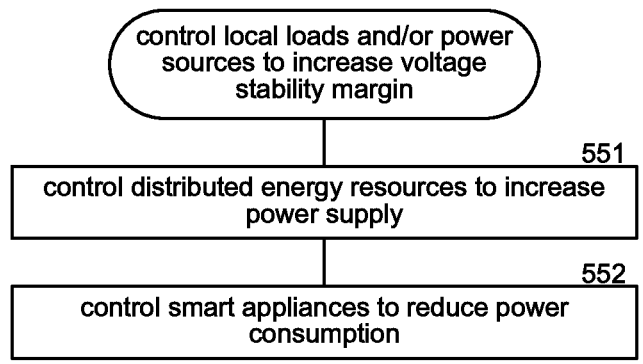
FIG. 5 is a flow diagram that illustrates the processing of a voltage stability control component of the voltage stability smart meter in accordance with some embodiments of the present technology.

FIGS. 3-5 are flow diagrams that more specifically illustrate the processing of the blocks 221-223, respectively, shown in FIG. 2. For example, FIG. 3 illustrates the processing of a critical voltage detection component (block 221) of the meter 112 in accordance with some embodiments of the present technology. In block 331, the meter 112 records historical measurements of non-critical meter data. In some embodiments, the meter 112 can record voltage, current, and/or other measurements of non-critical (e.g., normal) power usage over a predetermined time period (e.g., a day, a week, etc.). In many instances, the historical data will include relatively large fluctuations because it is recorded at the end-user level—where power usage may vary greatly as appliances are turned on/off. In particular, the meter measurements can have higher levels of variation than those for the overall system 100 in which local fluctuations tend to aggregate and cancel one another. Accordingly, to reduce the likelihood of the meter 112 incorrectly determining that normal voltage characteristics are critical voltage characteristics (e.g., voltage profiles that may indicate a likely voltage collapse), the meter 112 can filter the historical data and leverage a machine learning algorithm to identify normal voltage characteristics.

More specifically, in block 332 the meter 112 can decompose the historical data into components with a different dynamic of time scale (e.g., every minute, hourly, daily, etc.). For example, the components may be voltage or power measurements. In some embodiments, the meter 112 can apply a recursive Hodrick-Prescott filter to the historical meter data to remove the cyclical component of the various time scales from the historical meter data. Then, in block 333, the meter 112 can train a machine learning model/algorithm for each time scale based on the components of the historical meter data with that same time scale. Specifically, for example, the components can be labeled with a characteristic (e.g., normal, abnormal, critical) and input into the machine learning model for training the machine learning model. Accordingly, in some embodiments the training data for the machine learning can be vectors of voltage over time (e.g., at time intervals) labeled as critical or normal voltage vectors. In some embodiments, the machine learning models are hidden Markov models. That is, for each time scale, the meter 112 can train a hidden Markov model to make predictions of non-critical (normal) voltage profiles by training the hidden Markov model on the recorded, non-critical historical meter data for that time scale.

In some embodiments, machine learning techniques other than a hidden Markov model may be employed to determine whether a measured voltage profile represents a critical voltage profile. Such machine learning techniques include a support vector machine, a Bayesian network, learning regression, and a neural network, when generating filters. A support vector machine may be trained using examples of non-critical voltage profiles and critical voltage profiles as training data. A support vector machine operates by finding a hypersurface in the space of possible inputs. The hypersurface attempts to split the positive examples (i.e., non-critical voltage profiles) from the negative examples (i.e., critical voltage profiles) by maximizing the distance between the nearest of the positive and negative examples and the hypersurface. A support vector machine simultaneously minimizes an empirical classification error and maximizes a geometric margin. This allows for correct classification of data that is similar to but not identical to the training data. Various techniques can be used to train a support vector machine. One technique uses a sequential minimal optimization algorithm that breaks the large quadratic programming problem down into a series of small quadratic programming problems that can be solved analytically. (See, e.g., "Sequential Minimal Optimization," http://research.microsoft.com/pubs/69644/tr-98-14.pdf.)

In some embodiments, the machine learning algorithm may be trained and applied by the meter 112 when the meter 112 has sufficient computational power. Alternatively, non-critical voltage profiles and critical voltage profiles (if any) may be securely uploaded to a server to perform the training of the machine learning algorithm. To help ensure the privacy of the voltage profiles of the end user 110, the information that is uploaded may be encrypted using various encryption techniques such as public/private key encryption. The trained machine learning parameters can then be downloaded to the meter 112 for use in applying the machine learning algorithm to identify critical voltage profiles. Alternatively, the machine learning algorithm may also be applied by the server to measure voltage profiles uploaded from the meter 112.

In block 334, the meter 112 uses the trained machine learning models to generate predicted non-critical voltage profiles. In block 335, the meter 112 compares a measured voltage profile to the predicted voltage profiles to determine whether the measured voltage profile is critical or non-critical. In some embodiments, the meter 112 can compare the measured voltage profile to the predicted voltage profiles in real-time or near real-time. In decision block 336, the meter 112 determines whether the measured voltage profile differs from any of the predicted voltage profiles by a predefined threshold. If so, the measured voltage profile is used to estimate the voltage stability margin in block 337, as described in greater detail below with reference to FIG. 4. If not, the meter 112 continues to monitor the voltage profile and compare the voltage profile to the predicted voltage profiles (block 335). In some embodiments, the predefined threshold can be determined/estimated from the historical meter data.

In some embodiments, the meter 112 can generate predicted non-critical voltage profiles (blocks 331-334) independently for each phase of the supplied power and can independently measure a voltage profile for each phase and compare it to the respective predicted voltage profiles (blocks 335-337). In one aspect of the present technology, the predicted voltage profiles account for noisy variations in voltage due to normal (non-critical) voltage start/stop operations of the end user 110. Therefore, the meter 112 can detect only critical voltage dips that may require active/reactive power support.

In some embodiments, the meter 112 can periodically update the predicted voltage profiles. For example, the meter 112 could periodically retrain the machine learning models (blocks 332-334) as new meter data is recorded over time.

FIG. 4 illustrates the processing of a real-time voltage stability margin estimation component (block 222 in FIG. 2) of the meter 112 in accordance with some embodiments of the present technology. In block 441, the meter 112 estimates the Thevenin voltage and impedance of the detected critical voltage profile (blocks 335 and 336 in FIG. 3). For example, the meter 112 can employ an estimation algorithm such as a Kalman filter, least square method, etc., to estimate the Thevenin voltage and impedance. More specifically, the voltage and current measurements for an individual phase of the detected critical profile can be written as:

$V=m+jn$ $I=p+jq$

The meter 112 can calculate the load impedance according to the following equation:

$$Z_L = \frac{V}{I}$$

The Thevenin voltage and Thevenin impedance can be written, respectively, as:

$E=E_r+jE_i$ $Z=R+jX$

In block 442, the meter 112 can determine the voltage stability margin and/or the power transfer margin for each phase. For example, the Thevenin voltage (E) and the impedance (Z) satisfy the following relation subject to the observation noise v:

$z=Hx\pm v$ where:

$z = [m \; n]^T$ $H = \begin{bmatrix} 1 & 0 & -p & q \\ 0 & 1 & -q & -p \end{bmatrix}$ $x = [E_r \; E_i \; R \; X]^T$ Using two or more measurement points, the Thevenin voltage and impedance can be estimated using a Kalman filter:

$P_n=(I-K_nH_n)P_{k-1}$ $K_n=P_nH_n^TR_n^{-1}$ $x_n=x_{n-1}+K_n(z_n-H_nx_{n-1})$ where R is the covariance matrix of measurement error. The maximum active and reactive power transfer can be calculated according to the following equations:

$$P_{max} = \frac{|E|^2|Y|\cos\phi}{2[1+\cos(\phi+\beta)]}$$

$$Q_{max} = \frac{|E|^2|Y|\sin\phi}{2[1+\cos(\phi+\beta)]}$$

where Y is the Thevenin admittance (i.e., 1/Z); where β is the angle of Y; and where φ is the power factor of the complex power given by the equation:

$P_{load}=VI^*$

Finally, the active power transfer margin is defined as $P_{margin}=P_{max}-P_{load}$ Thus, the meter 112 can estimate how much active power can be transferred to the end user 110 before voltage instability occurs. Put differently, when the Thevenin voltage equals the apparent impedance of the load, the max active power is transferred to the end user 110.

In decision block 443, the meter 112 compares the voltage stability margin to a predefined threshold. If the margin is greater than the predefined threshold, the meter 112 can determine that active/reactive power support is not needed (e.g., indicating that a voltage collapse event is unlikely) and can return and calculate a new or updated voltage stability margin based on subsequent meter measurements. If the margin is less than the predefined threshold (e.g., indicating that a voltage collapse event is likely or imminent), the meter 112 can determine that active/reactive power support is needed and can control local loads and/or power sources to increase the voltage stability margin in block 444.

In one aspect of the present technology, the meter 112 can determine a voltage stability margin individually for each phase. This can enable phase-wise active/reactive power support (block 444) that can advantageously account for unbalanced loading conditions (e.g., higher power draws of one phase).

FIG. 5 illustrates the processing of a voltage stability control component (block 223 in FIG. 2) of the meter 112 in accordance with some embodiments of the present technology. In blocks 551 and 552, after determining that the voltage stability margin for one or more phases is below the predefined threshold (block 443 in FIG. 4), the meter 112 can (i) control the local power sources 114 to increase the active power supply to the end user 110 and/or (ii) control the appliances 116 to reduce the active power consumption of the end user 110. By reducing the load and/or increasing the power supply to the end user 110 the voltage stability margin is increased—potentially averting a voltage collapse event that may otherwise occur. For example, the meter 112 could send a control signal to a smart HVAC system to reschedule a cooling cycle (e.g., to delay and/or reduce the cooling) to reduce the current active power consumption of the end user 110. Similarly, the meter 112 could send a control signal to a smart-inverter-enabled photovoltaic system to redirect/increase power transfer to the end user 110.

Accordingly, the present technology provides a bottom-up (e.g., demand-side) approach to active power monitoring and active/reactive power support. As the number of smart meters continues to grow—currently about 71 million smart meters are installed in the United States—the present technology can significantly improve the resiliency of grid power systems. The voltage stability smart meter systems of the present technology can also be combined with other transmission side strategies for mitigating voltage collapse events.

The computing systems (e.g., network nodes or collections of network nodes) on which the smart meters and the other described systems may be implemented may include a central processing unit, controller, input devices, output devices (e.g., display devices and speakers), storage devices (e.g., memory and disk drives), network interfaces, graphics processing units, cellular radio link interfaces, global positioning system devices, and so on. The input devices may include keyboards, pointing devices, touch screens, gesture recognition devices (e.g., for air gestures), head and eye tracking devices, microphones for voice recognition, and so on. The computing systems may include high-performance computing systems, cloud-based servers, desktop computers, laptops, tablets, e-readers, personal digital assistants, smartphones, gaming devices, servers, and so on. For example, the simulations and training may be performed using a high-performance computing system, and the classifications may be performed by a tablet. The computing systems may access computer-readable media that include computer-readable storage media and data transmission media. The computer-readable storage media are tangible storage means that do not include a transitory, propagating signal. Examples of computer-readable storage media include memory such as primary memory, cache memory, and secondary memory (e.g., DVD) and other storage. The computer-readable storage media may have recorded on them or may be encoded with computer-executable instructions or logic that implements the smart meters and the other described systems. The data transmission media are used for transmitting data via transitory, propagating signals or carrier waves (e.g., electromagnetism) via a wired or wireless connection. The computing systems may include a secure cryptoprocessor as part of a central processing unit for generating and securely storing keys and for encrypting and decrypting data using the keys.

The smart meters and the other described systems may be described in the general context of computer-executable instructions, such as program modules and components, executed by one or more computers, controllers, processors, or other devices. Generally, program modules or components include routines, programs, objects, data structures, and so on that perform tasks or implement data types of the smart meters and the other described systems. Typically, the functionality of the program modules may be combined or distributed as desired in various examples. Aspects of the smart meters and the other described systems may be implemented in hardware using, for example, an application-specific integrated circuit ("ASIC") and/or field programmable gate array ("FPGA").

Several aspects of the present technology are set forth in the following examples:

1. A method performed by an electric meter of an end user in a power system, the method comprising:
   measuring voltage data;
   analyzing the voltage data to detect a critical voltage characteristic;
   estimating an electrical margin based on the voltage data; and
   controlling an electrical power source, an electric appliance, or both the electrical power source and the electric appliance to increase the electrical margin.
2. The method of example 1 wherein analyzing the voltage data to detect the critical voltage characteristic includes—
   decomposing historical measurements of the voltage data into components with different time scales;
   training a machine learning model for each time scale based on the components with that time scale;
   generating predicted voltage profiles using the machine learning models; and
   determining whether the measured voltage data differs from any of the predicted voltage profiles by a predetermined threshold.
3. The method of example 2 wherein decomposing the historical measurements of the voltage data includes applying a recursive Hodrick-Prescott filter to the historical measurements of the voltage data.
4. The method of example 2 or example 3 wherein training the machine learning model for each time scale includes training a hidden Markov model for each time scale.
5. The method of any one of examples 1-4 wherein the electrical margin is a voltage stability margin.
6. The method of example 5 wherein estimating the voltage stability margin includes estimating a Thevenin voltage and impedance for the voltage data.
7. The method of any one of examples 1-4 wherein the electrical margin is an active power transfer margin.
8. The method of any one of examples 1-4 wherein measuring the voltage data includes measuring voltage data for a plurality of phases.
9. The method of example 8 wherein estimating the electrical margin includes estimating a voltage stability margin for each phase.
10. The method of any one of examples 1-9, further comprising:
    determining whether the electrical margin is below a predetermined threshold; and
    when the electrical margin is below the predetermined threshold, controlling the electrical power source, the electric appliance, or both the electrical power source and the electric appliance to increase the electrical margin.
11. The method of any one of examples 1-10 wherein controlling the electrical power source, the electric appliance, or both the electrical power source and the electric appliance includes sending a control signal to a smart electric appliance to reduce a power consumption of the smart electric appliance to thereby reduce a power consumption of the end user.
12. The method of any one of examples 1-11 wherein controlling the electrical power source, the electric appliance, or both the electrical power source and the electric appliance includes sending a control signal to a smart photovoltaic panel to increase power transfer to the end user.
13. An electric meter, comprising:
    circuitry configured to measure a voltage value at a location of an end user in a power system; and
    a controller configured to—
        analyze the voltage value to detect a critical voltage characteristic;

determine an electrical margin based on the voltage value; and control an electrical power source, an electric appliance, or both the electrical power source and the electric appliance to increase the electrical margin.

14. The electric meter of example 13 wherein the controller is configured to analyze the voltage value to detect the critical voltage characteristic by—
generating predicted voltage values based on historical measurements of the voltage value; and
determining whether the measured voltage value differs from any of the predicted voltage values by a predetermined threshold.

15. The electric meter of example 14 wherein the controller is configured to generate the predicted voltage values by—
decomposing the historical measurements of the voltage value into components with different time scales;
training a machine learning model for each time scale based on the components with that time scale; and
generating the predicted voltage values using the machine learning models.

16. The electric meter of example 13 wherein the controller is configured to analyze the voltage value to detect the critical voltage characteristic by—
sending historical measurements of the voltage value to a remote server;
receiving predicted voltage values from the remote server; and
determining whether the measured voltage value differs from any of the predicted voltage values by a predetermined threshold.

17. The electric meter of any one of examples 13-16 wherein the electrical margin is a voltage stability margin, an active power transfer margin, or both a voltage stability margin and an active power transfer margin.

18. A system for monitoring and controlling a power system including a plurality of end users, a plurality of distributed electrical power sources, and a plurality of electric appliances, the system comprising:
a plurality of electric meters each positioned at a location of a corresponding one of the end users, wherein individual ones of the electric meters include (a) circuitry configured to measure a voltage profile at the location of the corresponding one of the end users in the power system and (b) a controller configured to—
detect a critical voltage characteristic based on the voltage profile;
estimate an electrical margin based on the voltage profile; and
control (a) at least one of the electrical power sources, (b) at least one of the electric appliances, or (c) both the at least one of the electrical power sources and the at least one of the electric appliances to reduce the likelihood of a voltage collapse event within the power system.

19. The system of example 18, further comprising a server remote from the electric meters and communicatively coupled to the electric meters, wherein the server is configured to—
receive historical measurements of the voltage profiles from the electric meters;
generate predicted voltage profiles for individual ones of the end users based on the historical measurements of the voltage profiles; and
send the predicted voltage profiles to the electric meters at the locations corresponding to the individual ones of the end users.

20. The system of example 19 wherein the controllers of the electric meters are further configured to detect the critical voltage characteristic by comparing the measured voltage profile to the predicted voltage profile.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the technology. Further, while advantages associated with some embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method performed by an electric meter of an end user in a power system, the method comprising:
measuring, at the electric meter, voltage data associated with use of electrical power by the end user, wherein the electric meter is positioned at a location of the end user, and wherein the end user receives the electrical power from a power station of the power system via a transmission system of the power system;
analyzing, at the electric meter, the voltage data to detect a critical voltage characteristic, by—
decomposing historical measurements of the voltage data into components with different time scales,
training a plurality of machine learning models, by training a separate machine learning model for each time scale based on the components with that time scale,
generating predicted voltage profiles using the trained machine learning models, and
determining whether the measured voltage data differs from any of the predicted voltage profiles by a predetermined threshold;

estimating, at the electric meter, an electrical margin of the end user based on the voltage data; and controlling, via the electric meter, an electrical power source other than the power station to change an active power supply to the end user and controlling an electric appliance to change an active power consumption of the end user to increase the electrical margin of the end user independent from any adjustment of the electrical power supplied to the end user from the power station, wherein the electrical power source and the electric appliance are local to the end user in the power system.

2. The method of claim 1 wherein decomposing the historical measurements of the voltage data includes applying a recursive Hodrick-Prescott filter to the historical measurements of the voltage data.

3. The method of claim 1 wherein training the machine learning model for each time scale includes training a hidden Markov model for each time scale.

4. The method of claim 1 wherein the electrical margin is a voltage stability margin.

5. The method of claim 4 wherein estimating the voltage stability margin includes estimating a Thevenin voltage and impedance for the voltage data.

6. The method of claim 1 wherein the electrical margin is an active power transfer margin.

7. The method of claim 1 wherein measuring the voltage data includes measuring voltage data for a plurality of phases.

8. The method of claim 7 wherein estimating the electrical margin includes estimating a voltage stability margin for each phase.

9. The method of claim 1, further comprising:
determining whether the electrical margin is below a predetermined threshold; and
when the electrical margin is below the predetermined threshold, controlling the electrical power source to change the active power supply to the end user and controlling the electric appliance to change the active power consumption of the end user to increase the electrical margin.

10. The method of claim 1 wherein controlling the electric appliance includes sending a control signal to a smart electric appliance to reduce a power consumption of the smart electric appliance to thereby reduce the active power consumption of the end user.

11. The method of claim 1 wherein controlling the electrical power source includes sending a control signal to a smart photovoltaic panel to increase the active power supply to the end user.

12. An electric meter configured to be positioned at a location of an end user in a power system, comprising:
circuitry configured to measure a voltage value associated with use of electrical power by the end user, wherein the circuitry is positioned at the electric meter at the location of the end user, and wherein the end user receives the electrical power from a power station of the power system via a transmission system of the power system; and
a controller positioned at the electric meter at the location of the end user, wherein the controller is configured to—
analyze the voltage value to detect a critical voltage characteristic, by—
decomposing historical measurements of voltage data into components with different time scales;
training a plurality of machine learning models, by training a separate machine learning model for each time scale based on the components with that time scale;
generating predicted voltage profiles using the trained machine learning models; and
determining whether the measured voltage data differs from any of the predicted voltage profiles by a predetermined threshold;
determine an electrical margin of the end user based on the voltage value; and
control an electrical power source other than the power station to change an active power supply to the end user and control an electric appliance to change an active power consumption of the end user to increase the electrical margin of the end user independent from any adjustment of the electrical power supplied to the end user from the power station, wherein the electrical power source and the electric appliance are local to the end user in the power system.

13. The electric meter of claim 12 wherein the controller is configured to analyze the voltage value to detect the critical voltage characteristic by—
sending historical measurements of the voltage value to a remote server;
receiving predicted voltage values from the remote server; and
determining whether the measured voltage value differs from any of the predicted voltage values by a predetermined threshold.

14. The electric meter of claim 12 wherein the electrical margin is a voltage stability margin, an active power transfer margin, or both a voltage stability margin and an active power transfer margin.

15. A system for monitoring and controlling a power system including a plurality of end users, a plurality of distributed electrical power sources, and a plurality of electric appliances, the system comprising:
a plurality of electric meters each positioned at a location of a corresponding one of the end users, wherein the end users receive electrical power from a power station of the power system other than the electrical power sources via a transmission system of the power system, wherein individual ones of the electric meters include (a) circuitry configured to measure a voltage profile at the location of the corresponding one of the end users in the power system and associated with use of the electrical power by the corresponding one of the end users and (b) a controller configured to—
receive a predicted voltage profile generated by use of a plurality of trained machine learning models, each of the plurality of machine learning models having been trained for a different time scale with historical measurements of voltage data;
detect a critical voltage characteristic based on the measured voltage profile by comparing the measured voltage profile to the predicted voltage profile;
estimate an electrical margin of the corresponding one of the end users based on the measured voltage profile; and
control at least one of the electrical power sources to change an active power supply to the corresponding one of the end users and control at least one of the electric appliances to change an active power consumption of the corresponding one of the end users to increase the electrical margin of the corresponding one of the end users independent from any adjustment of the electrical power supplied to the corresponding one of the end users from the power station to thereby reduce the likelihood of a voltage collapse event within the power system, wherein the at least one of the electrical power sources and the at least one of the electric appliances are positioned at the location of the corresponding one of the end users.

16. The system of claim 15, further comprising a server remote from the electric meters and communicatively coupled to the electric meters, wherein the server is configured to—
- receive historical measurements of the voltage profiles from the electric meters;
- generate predicted voltage profiles for individual ones of the end users based on the historical measurements of the voltage profiles; and
- send the predicted voltage profiles to the electric meters at the locations corresponding to the individual ones of the end users.

17. The method of claim 1 wherein controlling the electrical power source to change the active power supply to the end user comprises controlling the electrical power source to increase the active power supply to the end user, and wherein controlling the electric appliance includes controlling the electric appliance to decrease the active power consumption of the end user.

18. The method of claim 17 wherein—
- controlling the electric appliance includes sending a control signal to a smart electric appliance to reduce a power consumption of the smart electric appliance to thereby reduce the active power consumption of the end user; and
- controlling the electrical power source includes sending a control signal to a smart photovoltaic panel to increase the active power supply to the end user.

* * * * *